United States Patent
Soell et al.

(10) Patent No.: US 9,651,612 B2
(45) Date of Patent: May 16, 2017

(54) METHOD AND DEVICE FOR DIAGNOSING A DISCHARGE CIRCUIT OF AN ELECTRICAL SYSTEM

(71) Applicant: Robert Bosch GmbH, Stuttgart (DE)

(72) Inventors: Max Soell, Ludwigsburg (DE); Ellen Wahl-Raabe, Besigheim (DE)

(73) Assignee: Robert Bosch GmbH, Stuttgart (DE)

( * ) Notice: Subject to any disclaimer, the term of this patent is extended or adjusted under 35 U.S.C. 154(b) by 498 days.

(21) Appl. No.: 13/851,506

(22) Filed: Mar. 27, 2013

(65) Prior Publication Data

US 2013/0257446 A1    Oct. 3, 2013

(30) Foreign Application Priority Data

Mar. 27, 2012 (DE) .......................... 10 2012 204 866

(51) Int. Cl.

| | |
|---|---|
| *G01R 31/00* | (2006.01) |
| *G01R 31/28* | (2006.01) |
| *B60L 11/18* | (2006.01) |
| *B60L 3/00* | (2006.01) |
| *B60L 3/04* | (2006.01) |

(Continued)

(52) U.S. Cl.

CPC ............ *G01R 31/28* (2013.01); *B60L 3/0007* (2013.01); *B60L 3/0069* (2013.01); *B60L 3/04* (2013.01); *B60L 3/12* (2013.01); *B60L 11/14* (2013.01); *B60L 11/1803* (2013.01); *B60L 11/1898* (2013.01); *G01R 31/006* (2013.01); *B60L 2210/40* (2013.01); *G01R 31/2827* (2013.01); *Y02T 10/70* (2013.01); *Y02T 10/7077* (2013.01); *Y02T 10/7241* (2013.01); *Y02T 90/34* (2013.01)

(58) Field of Classification Search
CPC ...... G01R 31/00; G01R 31/28; G01R 31/006; G01R 31/2827; G01R 31/44; G01R 31/2635; G01R 31/007; G01R 31/025; G01R 31/026; G01R 31/3651; G01R 35/00; B60L 11/1803; B60L 3/007; B60L 3/0069; B60L 3/04; B60L 3/12; B60L 11/14; B60L 11/1898; B60L 2210/40; Y02T 10/7077; Y02T 10/7241; Y02T 90/34; Y02T 10/70; H02J 7/025; H02J 7/007; H02J 7/0052
USPC ....... 324/503, 506, 510, 511, 512, 522, 526, 324/429, 414, 404, 133
See application file for complete search history.

(56) References Cited

U.S. PATENT DOCUMENTS

| | | | |
|---|---|---|---|
| 2,611,008 A * | 9/1952 | Wilcock et al. | ............... 324/503 |
| 4,380,731 A * | 4/1983 | Alker | ..................... G01R 31/00 |
| | | | 324/525 |
| 4,636,705 A * | 1/1987 | Bowman | ......................... 322/28 |

(Continued)

FOREIGN PATENT DOCUMENTS

| | | |
|---|---|---|
| DE | 102009055053 | 6/2011 |
| WO | 2011/128046 | 10/2011 |

*Primary Examiner* — Patrick Assouad
*Assistant Examiner* — Taqi Nasir
(74) *Attorney, Agent, or Firm* — Michael Best & Friedrich LLP

(57) ABSTRACT

A method and an apparatus for diagnosing a discharge circuit, wherein provision is made for the discharge circuit for discharging an electrical system, in particular for discharging an electrical system of a vehicle capable of being electrically driven. In order to achieve this end, means are provided which partially discharge the electrical system by means of said discharge circuit in a procedural step for diagnosing said discharge circuit.

15 Claims, 2 Drawing Sheets

(51) Int. Cl.
  *B60L 3/12* (2006.01)
  *B60L 11/14* (2006.01)

(56) References Cited

U.S. PATENT DOCUMENTS

| | | | | |
|---|---|---|---|---|
| 4,922,183 | A * | 5/1990 | Kamas | G01M 3/165 324/522 |
| 5,153,496 | A * | 10/1992 | LaForge | H02J 7/0013 320/119 |
| 5,412,794 | A * | 5/1995 | Phoenix | G06F 11/24 703/21 |
| 5,459,449 | A * | 10/1995 | Ravas et al. | 340/438 |
| 5,637,978 | A * | 6/1997 | Kellett et al. | 320/104 |
| 6,002,221 | A * | 12/1999 | Ochiai et al. | 318/139 |
| 6,064,313 | A * | 5/2000 | Anderson | G01R 31/045 324/508 |
| 6,324,042 | B1 * | 11/2001 | Andrews | G01R 31/00 323/283 |
| 7,729,848 | B2 * | 6/2010 | Gotzenberger | 701/114 |
| 8,022,710 | B2 * | 9/2011 | Ivan et al. | 324/522 |
| 8,653,841 | B2 * | 2/2014 | Ho | B60L 3/0007 318/376 |
| 2002/0008523 | A1 * | 1/2002 | Klang | G01R 31/3631 324/429 |
| 2005/0029990 | A1 * | 2/2005 | Tsukamoto et al. | 320/135 |
| 2005/0052187 | A1 * | 3/2005 | Bertness | G01R 31/006 324/503 |
| 2006/0224360 | A1 * | 10/2006 | Kishimoto | 702/183 |
| 2007/0026711 | A1 * | 2/2007 | Chorian et al. | 439/174 |
| 2008/0079434 | A1 * | 4/2008 | Oosawa | H01M 10/48 324/433 |
| 2008/0143298 | A1 * | 6/2008 | Yoshida | G01R 31/3658 320/136 |
| 2008/0191656 | A1 * | 8/2008 | Satake | B60L 11/1803 318/722 |
| 2008/0316007 | A1 * | 12/2008 | Brinton et al. | 340/425.5 |
| 2009/0198399 | A1 * | 8/2009 | Kubo | B60L 11/1855 701/22 |
| 2009/0255740 | A1 * | 10/2009 | Baglino | B60L 11/1803 180/65.8 |
| 2009/0268354 | A1 * | 10/2009 | Kaplan | 361/15 |
| 2010/0250194 | A1 | 9/2010 | Newhouse et al. | |
| 2010/0296204 | A1 * | 11/2010 | Ichikawa | B60K 6/445 361/15 |
| 2011/0031939 | A1 * | 2/2011 | Funaba et al. | 320/166 |
| 2011/0050136 | A1 * | 3/2011 | Sumi et al. | 318/400.3 |
| 2011/0057627 | A1 * | 3/2011 | Kuehner | 320/166 |
| 2011/0216458 | A1 * | 9/2011 | Blanc et al. | 361/91.1 |
| 2012/0007574 | A1 * | 1/2012 | Sakai | G01R 15/08 323/299 |
| 2012/0035870 | A1 * | 2/2012 | Bertness | G01R 31/006 702/59 |
| 2012/0109443 | A1 * | 5/2012 | Takahashi | B60L 1/003 701/22 |
| 2012/0161679 | A1 * | 6/2012 | Goldammer et al. | 318/400.3 |
| 2012/0242344 | A1 * | 9/2012 | Ishishita | B60L 3/0046 324/430 |
| 2012/0321917 | A1 * | 12/2012 | Kazuno | H01M 16/006 429/9 |
| 2013/0127415 | A1 * | 5/2013 | Ohtomo | B60L 3/003 320/109 |
| 2013/0175999 | A1 * | 7/2013 | Thieme et al. | 320/136 |
| 2013/0200731 | A1 * | 8/2013 | Werner et al. | 307/326 |
| 2013/0293248 | A1 * | 11/2013 | Ho | B60L 3/0007 324/750.01 |
| 2014/0312685 | A1 * | 10/2014 | Moga | 307/9.1 |

* cited by examiner

METHOD AND DEVICE FOR DIAGNOSING A DISCHARGE CIRCUIT OF AN ELECTRICAL SYSTEM

BACKGROUND OF THE INVENTION

The present invention relates to a method for diagnosing a discharge circuit of an electrical system, a corresponding apparatus as well as to a drive train.

TECHNICAL FIELD

Electrical systems comprising intermediate circuits, in particular DC intermediate circuits, are known from use in electrically driven vehicles. The electrical systems serve, for example, to couple batteries to electrical machines, in particular drive motors. In such electrical systems, the DC voltage of the battery is, for example, transmitted via the intermediate circuit to a power inverter. By means of the power inverter, said DC voltage is converted into an AC voltage to supply the electrical machine. Current peaks and voltage peaks arise during the switching operations in the power inverter which are required for this purpose. An intermediate circuit capacitor is, for example, provided between the battery and the power inverter for energy buffering and thus for damping said current peaks and voltage peaks. After the operation or a trip with the vehicle has been completed, the battery is decoupled from the voltage network by means of switches. If the loads connected to the voltage network are likewise switched off and do not use any further power, the charge energy remains in the intermediate circuit capacitor. A voltage, in particular a high voltage, thus prevails in the electrical system which is connected to the intermediate circuit capacitor and comprises the same. The voltage network, in particular the DC voltage network, which is connected directly to the intermediate circuit capacitor, is referred to as the intermediate circuit. It is desirable that voltage no longer be applied to the voltage network of a vehicle after operation of the vehicle has been completed or that the applied voltage undershoots a predefinable voltage value; and therefore there is no risk of injury to passengers, service personnel or first responders. For that reason, there are discharge or emergency discharge circuits, which selectively discharge this charge energy when a breakdown of the electrical systems of a vehicle occurs, for example in the case of an accident. To this end, a method for discharging the intermediate circuit capacitor in a high voltage network via a discharge circuit is known from the German patent application DE 10 2009 055 053. The WIPO patent application WO 2011/128046 discloses a high-voltage system for a motor vehicle comprising a discharge circuit. The high-voltage system further comprises a diagnostic device having a measurement device for measuring a voltage course during the discharge process in order to evaluate said voltage course in regard to a malfunction of the high-voltage system.

SUMMARY OF THE INVENTION

The present invention provides a method for diagnosing a discharge circuit, with which an electrical system, in particular an electrical system of an electrically driven vehicle, is discharged. To this end, the electrical system is partially discharged by means of the discharge circuit in a procedural step of the method for diagnosing a discharge circuit.

A partial discharge of the electrical system by means of the discharge circuit already enables a diagnosis as to whether the discharge circuit is functioning as required. During the procedural step of the diagnostic method, the discharge circuit is thereby advantageously electrically loaded to a lesser extent than when a complete discharge of the electrical system occurs.

In one embodiment of the invention, the voltage in the electrical system is measured during the procedural step for diagnosing the discharge circuit, and a voltage drop which occurs is determined at least once, in particular a plurality of times, and compared with at least one, in particular a plurality of, correspondingly predefined value(s) for the voltage drop.

The voltage drop, which occurs in the electrical system during the procedural step for diagnosing the discharge circuit, for example at the intermediate circuit capacitor, is a measurement for the completed discharge by means of the discharge circuit. A comparison of this value with a predefined value for the voltage drop thus advantageously enables a diagnosis of the discharge system as to whether said system is functioning as required. The predefined value for the voltage drop is, for example, determined on the basis of the electrical parameters of the components of the circuit as well as on the voltage applied at the beginning of the reference period and the length of the discharge process. This value can, for example, be calculated at present and predefined or be predefined with the aid of a characteristic diagram. The determination of said voltage drop and the corresponding comparison are especially carried out a number of times during the procedural step for diagnosing the discharge circuit. In so doing, a possibility for checking the plausibility of a single result of a comparison is provided.

In one embodiment of the invention, the discharge circuit is recognized to be defective if the amount of the difference between a particular voltage drop in the electrical system during the procedural step for diagnosing the discharge method and the predefined voltage drop exceeds a predefinable tolerance value. The discharge circuit is particularly considered to be defective if the voltage drop is determined a number of times and the amounts of the differences between said determined drops in voltage and the predefined drops in voltage exceed a predefined tolerance value a corresponding number of times.

A method is advantageously provided in order to evaluate the diagnosis of the discharge circuit or, respectively, in order to be able to decide whether the discharge circuit functions as required or not, i.e. is notably defective.

In one embodiment of the invention, the discharge circuit is a first discharge circuit and the electrical system comprises a further or, respectively, second discharge circuit. The method for diagnosing the first discharge circuit comprises a first step, in which the electrical system is partially discharged by means of the second discharge circuit, and the succeeding procedural step for diagnosing the first discharge circuit, in which the electrical system is further, in particular partially, discharged by means of the first discharge circuit.

In one embodiment of the invention, a succeeding step, in which the electrical system is further discharged by means of the second discharge circuit, follows the procedural step for diagnosing the first discharge circuit, in which the electrical system is further, in particular partially, discharged by means of the first discharge circuit.

In one embodiment of the invention, the discharge circuit is a first discharge circuit and the electrical system comprises a further or, respectively, second discharge circuit. The method for diagnosing the first discharge circuit comprises the procedural step for diagnosing the first discharge circuit, in which the electrical system is partially discharged by means of the first discharge circuit, and a further step in which the electrical system is further discharged by means of the second discharge circuit.

Due to the partial discharge processes by means of the second discharge circuit, the diagnosis of the first discharge circuit can be carried out in a selectable voltage range and time period and with a predefinable charge quantity. In so doing, the higher the voltage at the beginning of the procedural step for diagnosing the first discharge circuit is and the longer said procedural step lasts, the higher the electrical load of the first discharge circuit is. A method for carrying out the diagnosis of a first discharge circuit is therefore advantageously provided, in which the electrical load, which occurs during the diagnosis of the first discharge circuit, can be set in such a manner that no irreversible damage to the first discharge circuit occurs.

In one embodiment of the invention, the procedural step for diagnosing the discharge circuit is carried out for a predefinable, limited time period. Said time period is particularly limited to approximately 200-500 ms.

The time period is specified sufficiently long so that the diagnosis can be carried out and the discharge circuit is advantageously only slightly electrically loaded.

In one embodiment of the invention, at most a limited proportion of the charge contained in the electrical system, in particular 5%, is discharged by means of the procedural step for diagnosing the discharge circuit.

The charge quantity to be discharged is predefined such that the diagnosis is carried out and the discharge circuit is advantageously only slightly electrically loaded.

In one embodiment of the invention, the procedural step for diagnosing the discharge circuit is performed if the electrical voltage in the electrical system lies below a predefinable value. The procedural step for diagnosing the discharge circuit is particularly performed if the voltage lies below approximately 170 volts.

The threshold value, from which the procedural step for diagnosing the discharge circuit is performed, is reduced to such an extent that the current through the discharge circuit, which arises as a result of the discharge when carrying out the diagnosis, advantageously stays so low that the discharge circuit neither ages nor is irreversibly damaged.

In one embodiment of the invention, the first discharge circuit is an emergency discharge circuit. The emergency discharge circuit serves to discharge the electrical system if a defect is present within the electrical system. The first discharge circuit is especially employed to discharge the electrical system if the second discharge circuit is no longer functioning as required and is therefore defective.

A method is therefore advantageously provided, with which the functionality of an emergency discharge circuit can be diagnosed as often as desired, although the emergency discharge circuit is designed such that it can withstand the electrical stress of a discharge, in particular a discharge cycle, of the electrical system only in rare cases, for example when a defect is present within the electrical system.

In one embodiment of the invention, the discharge circuit is designed such that the discharge circuit is defective after carrying out a limited number of discharge cycles. By the term discharge cycle, especially a discharge of the electrical system is hereby understood up to an electrical voltage which presents no risk of injury to a living being. A discharge cycle therefore comprises the discharge of the electrical system to the extent that is required for every shutdown of the vehicle after completing a trip; thus enabling the vehicle to present no potential risk to the environment and the surroundings even in the event of a malfunction. Such a discharge system is particularly designed for carrying out approximately 30 discharge cycles. Such a discharge circuit ages during each individual discharge cycle. In the event of further electrical stress, in particular when exceeding approximately 30 discharge cycles, said discharge circuit is destroyed. By a limited number, a number is therefore understood in this connection, which lies considerably below the number of driving cycles (for example 10,000), for which a vehicle is designed over the service life thereof of, for example, 12 years.

A diagnostic method is therefore also advantageously provided for discharge circuits which withstand only the electrical stress of a relatively small number of discharge cycles. The hardware of the discharge circuit can consequently be constructed from lighter, smaller and lower priced components. In so doing, the weight, the installation space as well as the costs of a corresponding control device are reduced.

In one embodiment of the invention, the method for diagnosing the discharge circuit is performed during each driving cycle. A driving cycle especially comprises in this case the start-up of the vehicle at the beginning of the trip and the deactivation at the end of a trip with the vehicle.

A method is therefore advantageously provided, which enables a frequent diagnosis of the discharge circuit and yet the discharge circuit is only slightly electrically stressed.

The present invention provides an apparatus for diagnosing a discharge circuit. The discharge circuit is provided in this case to discharge an electrical system, in particular to discharge an electrical system of an electrically driven vehicle. Provision is made for means, which actuate the discharge circuit in such a manner that the electrical system is partially discharged in a procedural step for diagnosing the discharge circuit by means of the discharge circuit.

A partial discharge of the electrical system by means of the discharge circuit already enables a diagnosis as to whether the discharge circuit is functioning as required. An apparatus for diagnosing a discharge circuit is therefore advantageously designed, in which the discharge circuit is electrically stressed to a lesser extent during the procedural step of the diagnostic method in comparison to a complete discharge of the electrical system.

In one embodiment of the invention, the discharge circuit is a first discharge circuit and the electrical system comprises a further or, respectively, second discharge circuit. The actuation means actuate the first and the second discharge circuit for discharging the electrical system. In a first step, the electrical system is discharged partially by means of the second discharge circuit. In the succeeding procedural step for diagnosing the first discharge circuit, the electrical system is further, in particular partially, discharged by means of the first discharge circuit.

In one embodiment of the invention, the actuation means actuate the first and the second discharge circuit subsequent to the procedural step for diagnosing the discharge circuit such that the electrical system is further discharged by means of the second discharge circuit.

In one embodiment of the invention, the discharge circuit is a first discharge circuit and the electrical system comprises a further or, respectively, second discharge circuit. The actuation means actuate the first and the second discharge circuit for discharging the electrical system. In the procedural step for diagnosing the first discharge circuit, the electrical system is partially discharged by means of the first discharge circuit. In the succeeding step, the electrical system is further discharged by means of the second discharge circuit.

Because the second discharge step is designed such that the electrical system is thereby partially discharged, an apparatus is advantageously provided, in which a diagnosis of the first discharge circuit can be performed in a selectable voltage range and time period and with a predefinable charge quantity. A diagnosis of the first discharge circuit is therefore advantageously possible with selectable electrical stress without irreversible damage to said first discharge circuit.

Provision is further made in the invention for a drive train of a vehicle having an apparatus for diagnosing a discharge circuit. In this case, the discharge circuit is provided for discharging an electrical system, in particular for discharging an electrical system of an electrically driven vehicle. Provision is made for means which actuate the discharge circuit such that the electrical system is partially discharged in a procedural step for diagnosing the discharge circuit by means of the discharge circuit.

A partial discharge of the electrical system by means of the discharge circuit already enables a diagnosis as to whether the discharge circuit is functioning as required. A drive train for a vehicle is therefore advantageously designed in which the discharge circuit is electrically stressed to a lesser extent during the procedural step of the diagnostic method in comparison to a complete discharge of the electrical system.

It goes without saying that the features, properties and advantages of the method according to the invention correspondingly relate to or are applicable to the inventive apparatus or, respectively, the drive train and vice versa.

Further features and advantages of embodiments of the invention ensue from the following description with reference to the attached drawings.

DETAILED DESCRIPTION

Figure 1:
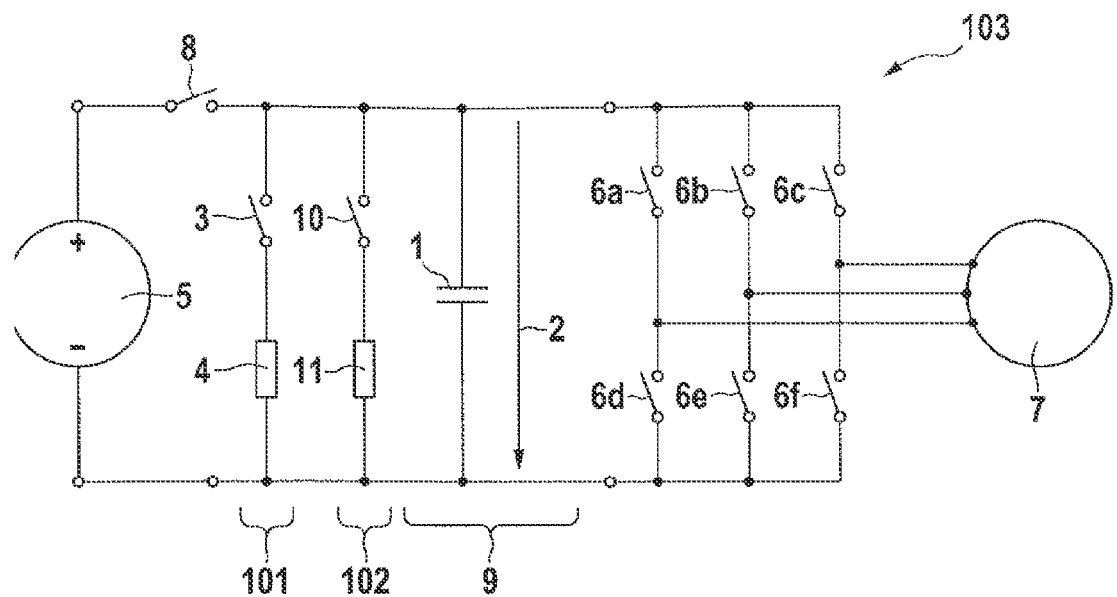
FIG. 1 shows an electrical system comprising a discharge circuit in schematic form.

In the figures, identical and functionally identical elements, features and components—provided that nothing else is embodied—are in each case furnished with the same reference numerals. It goes without saying that components and elements in the drawings are not necessarily depicted true to scale for reasons of clarity.

Further possible embodiments, modifications and implementations of the invention also do not comprise explicitly stated combinations of features of the invention which were described previously or are described below.

FIG. 1 shows an electrical system 103 comprising a discharge circuit 101 in schematic form. The discharge circuit 101 is depicted in FIG. 1 by way of example as a series circuit of an electrical load 4 and a switch 3 for switching on and off the discharge process. A further or, respectively, second discharge circuit 102 is connected in parallel to the discharge circuit 101, the former comprising, for example, likewise an electrical load 11 and a switch 10. The depicted electrical system 103 therefore comprises a first 101 and a second discharge circuit 102. To begin with, all forms of electrical loads are possible for discharge circuits. Said load can, for example, be an ohmic resistor, a PTC resistor, an electronic load, an impedance, a light bulb or a DC to DC converter, which feeds other loads from the high voltage on-board electrical system. The last option is particularly attractive because a DC-DC converter is typically used with electrical drives and is already in the system in order to supply the low voltage on-board electrical system with electricity from the high voltage on-board electrical system. The discharge circuits are connected in parallel to the intermediate capacitor 1. The first discharge circuit 101 is particularly designed such that it withstands the electrical stress of few discharge cycles. The second discharge circuit 102 is particularly designed such that it withstands the electrical stress of very many discharge cycles, in particular the average number of discharge cycles, which occur when shutting down the vehicle after completing a trip over the average service life of a vehicle. Hence, the first discharge circuit 101 represents a substitute or emergency discharge circuit for the case that a fault or defect is present in the electrical system 103 or in particular in the second discharge circuit 102. For that reason, the first discharge circuit 101 particularly consists of one or a plurality of PTC resistors. In particular as an emergency discharge circuit, said first discharge circuit is not in use during the majority of time in operation. The complexity and space requirements for this circuit should also be minimal for this reason. Components are thus used in this circuit, which only seldom withstand the electrical stress of an entire discharge cycle of the electrical system 103. The resistance of the PTC resistors advantageously increases during a discharge on account of said resistors heating up. In so doing, the power dissipation of said resistors decreases, whereby the resistor cools down again and is consequently electrically stressed to a lesser extent. Particularly controllable transistors are used as switches for the discharge circuit. A further discharge resistor, or a parasitic resistor can additionally be connected in parallel to the intermediate circuit capacitor 1 (not depicted in FIG. 1) in order to cover the improbable breakdown of both discharge circuits. Said further discharge resistor is however selected such that the dissipated power is very low. A switch as a source of trouble can therefore be eliminated because the resistor is permanently active.

The voltage 2 is applied to the intermediate circuit capacitor 1, which voltage can, for example, be measured at the poles of the intermediate circuit capacitor 1 by means of a voltage measuring device. A power source 5 which can be connected by means of a switch 8, such as, for example, a battery or fuel cell, is disposed in parallel to said intermediate circuit capacitor 1. The power storage unit 5 is decoupled from the electrical system 103 via the switch 8 prior to discharging the intermediate circuit capacitor 1 or, respectively, the intermediate circuit 9. Said intermediate circuit 9 particularly comprises the electrically conductive components which are connected to said intermediate circuit capacitor 1. A power inverter, which is likewise connected in parallel to said intermediate circuit capacitor 1, is configured by means of the switches 6a to 6f. To this end, the six switches 6a to 6f are disposed in such a manner that they form three half bridges which are connected in parallel and each comprise two controllable switches. A half bridge tap is formed in each case between each two switches, said half bridge tap being connected in each case to a phase conductor of the load 7 that can be connected. As is known from the prior art, free-wheeling diodes are respectively connected in parallel to the switches 6a to 6f (not depicted), which diodes enable a current flow in the opposite direction. By means of the power inverter or the switches 6a to 6f thereof, an electrical multi-phase, in particular three-phase, load 7, in particular an electrical machine, can be connected to the electrical system 103.

Figure 2:
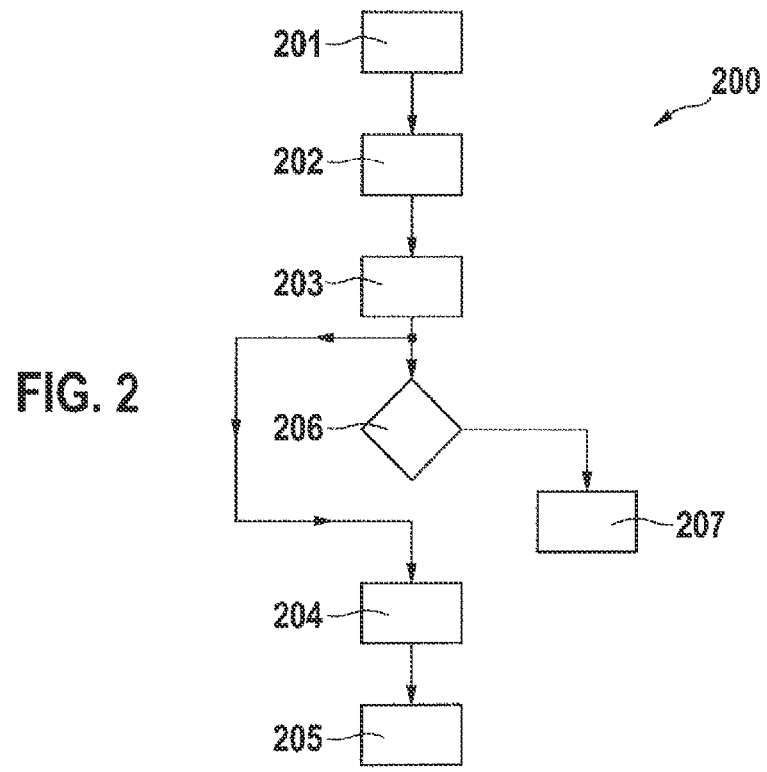
FIG. 2 shows a method according to the invention for diagnosing a discharge circuit in schematic form.

FIG. 2 shows a method 200 according to the invention for diagnosing a first discharge circuit. The start of the method for diagnosing a first discharge circuit 101 is depicted by block 201. The power storage unit 5 is thereby, for example, separated from the electrical system 103 by means of the switch 8. The actuation of the method for diagnosing a first discharge circuit 101 can particularly occur when shutting down the vehicle after completion of a trip with said vehicle or when the ignition of said vehicle is deactivated. In a succeeding first step 202, the electrical system 103, and therefore particularly the intermediate circuit capacitor 1, is, for example, partially discharged via the second discharge circuit 102 by an electrical circuit between the load 11 and the intermediate circuit capacitor 1 being closed as a result of closing the switch 10. Especially if the voltage 2 at the intermediate circuit capacitor 1 or in the intermediate circuit 9 has fallen below a threshold value or a predefinable time period has elapsed, the discharge process is concluded via the second discharge circuit 102 by means of opening the switch 10. The discharge is preferably concluded by means of the second discharge circuit 102 if the voltage 2 amounts to less than 170 volts. The switch 3 is subsequently closed and the procedural step 203 for diagnosing the first discharge circuit 101 begins. At this point, the electrical system 103 is partially discharged by means of the first discharge circuit 101. The electrical system is thereby particularly discharged via the load 4. The procedural step 203 for diagnosing the first discharge circuit 101 is especially concluded by opening the switch 3 if a predefinable time period has elapsed. Said time period is preferably limited to 200-500 ms. During the procedural step 203 for diagnosing the first discharge circuit 101, the voltage 2 is measured and the voltage drop occurring between the measurements is determined at least once or particularly a plurality of times. In step 206, the amount of the difference between a determined and a corresponding voltage drop calculated in advance is ascertained. If the amount of the difference exceeds a predefined value at least once, or particularly a plurality of times, the first discharge circuit 101 is recognized to be defective in step 207. Otherwise the operability of said first discharge circuit 101 is diagnosed as proper. In order that no risk to living beings can emanate from the electrical energy remaining in the electrical system, the discharge of the electrical system 103 by a renewed closing of the switch 10 via the second discharge circuit 102 is continued subsequently to the procedural step 203 for diagnosing the first discharge circuit 101 in step 204, in particular independently of steps 206 and 207. If the electrical energy from the electrical system 103 is consumed by the load 11 or the voltage 2 comprises but only a voltage that no longer presents a risk to living beings, the method for diagnosing a first discharge circuit 101 is concluded in step 205.

Figure 3:
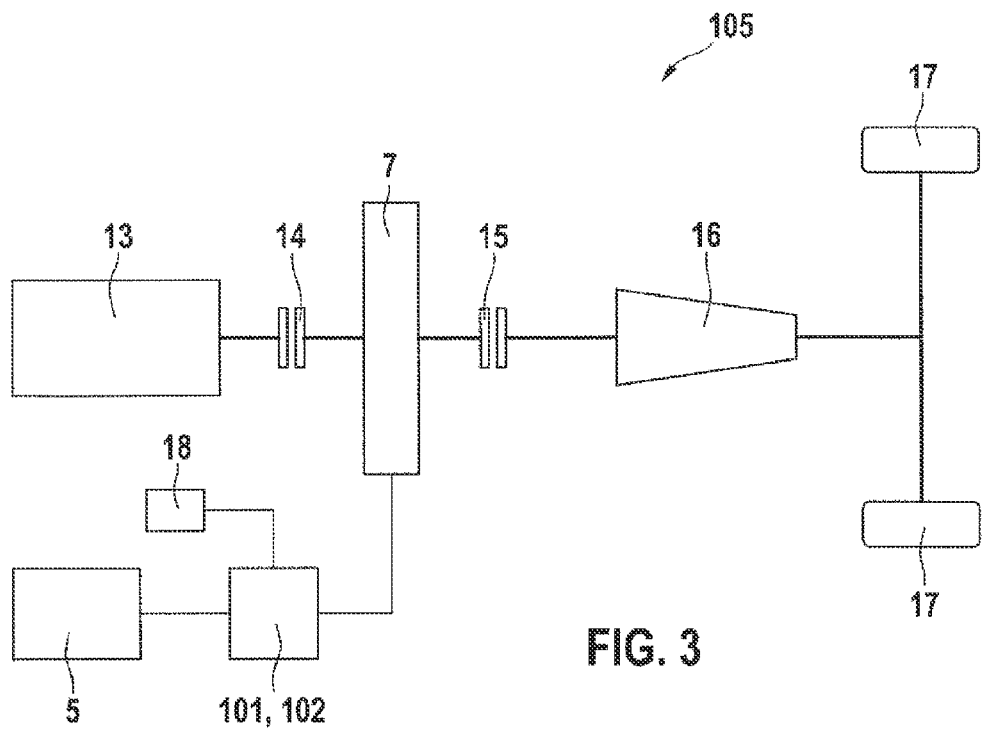
FIG. 3 shows a drive train according to the invention in schematic form for a motor vehicle having an apparatus for diagnosing a discharge circuit.

FIG. 3 shows a drive train 105 in schematic form for a vehicle having an apparatus for diagnosing a discharge circuit 101. By way of example, two drive units, a combustion engine 13 and an electrical machine 7 are provided in the drive train 105. The drive units 7, 13 can be mechanically coupled by means of the clutch 14. The rotational movement and the rotational torque of the drive units are transmitted to a transmission 16 by means of the clutch 15. The transmission 16 is coupled to the drive wheels 17 on the output side. Provision is made for means 18, in particular a control device, for actuating the discharge circuits 101 and 102 of the electrical system 103. Said means 18 actuate the discharge circuit 101 in such a manner that the electrical system 103 is partially discharged by means of the discharge circuit 101 in a procedural step 203 for diagnosing the discharge circuit 101.

Figure 4:
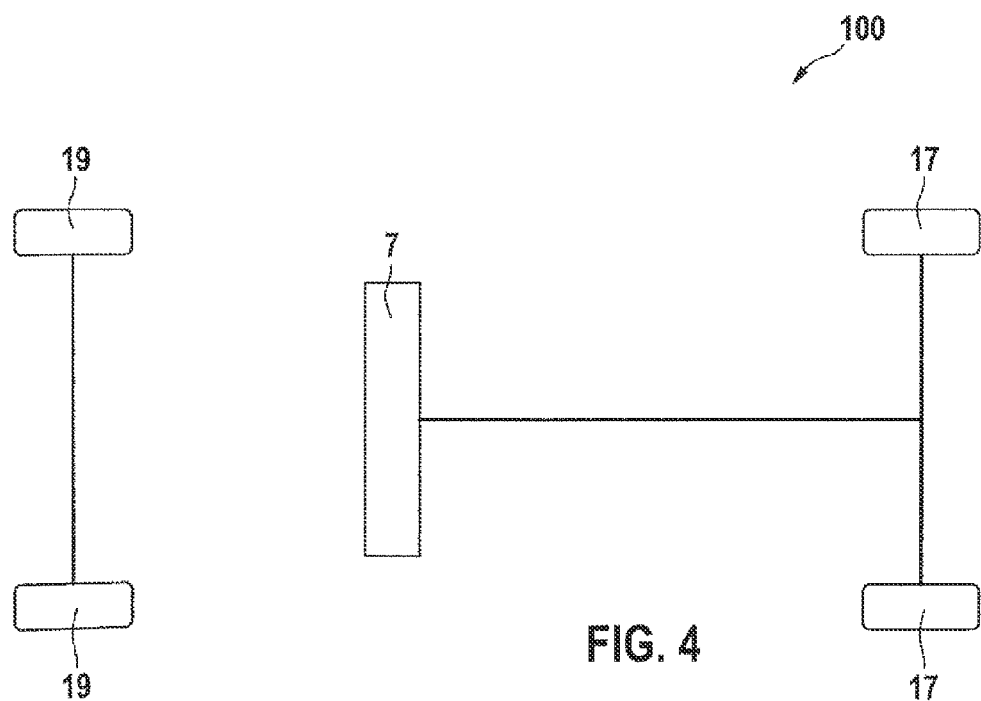
FIG. 4 shows a vehicle capable of being electrically driven in schematic form.

FIG. 4 shows a vehicle 100 which can be electrically driven. A drive unit 7 is depicted, in particular an electrical machine. The drive unit propels the drive wheels 17. Two further wheels 19 are situated at a further axle of the vehicle 100.

What is claimed is:

1. A method for diagnosing a discharge circuit in an electrical system of a vehicle capable of being electrically driven, the method comprising:
   measuring a voltage of the electrical system while partially discharging the electrical system by the discharge circuit;
   determining an amount of change of the measured voltage of the electrical system changes occurring partially discharging the electrical system by the discharge circuit;
   determining a difference amount between the amount of change and a predefined value; and
   recognizing the discharge circuit is defective when the difference amount is greater than a predefined threshold.

2. The method according to claim 1, wherein the discharge circuit is a first discharge circuit, and wherein the method further comprises partially discharging the electrical system by a second discharge circuit before partially discharging the electrical system by the first discharge circuit.

3. The method according to claim 2, wherein the method further comprises discharging the electrical system by the second discharge circuit after partially discharging the electrical system by the first discharge circuit.

4. The method according to claim 1, wherein the discharge circuit is a first discharge circuit, and wherein the method further comprises discharging the electrical system by a second discharge circuit after partially discharging the electrical system by the first discharge circuit.

5. The method according to claim 1, wherein the method further comprises partially discharging the electrical system by the discharge circuit for a predefined time period of 200 milliseconds to 500 milliseconds.

6. The method according to claim 1, wherein the method further comprises partially discharging the electrical system by the discharge circuit such that approximately 5% of a charge contained in the electrical system is discharged by the discharge circuit.

7. The method according to claim 1, wherein the method further comprises partially discharging the electrical system by the discharge circuit such that the voltage of the electrical system is less than 170 volts.

8. The method according to claim 1, wherein the method further comprises discharging the electrical system by the discharge circuit if a defect is present within the electrical system.

9. The method according to claim 1, wherein the method further comprises
   partially discharging the electrical system by the discharge circuit during a start of a trip with the vehicle, and
   partially discharging the electrical system by the discharge circuit during a completion of the trip with the vehicle.

10. An apparatus for diagnosing a discharge circuit in an electrical system of a vehicle capable of being electrically driven, the apparatus comprising:

a control device configured to:

measure a voltage of the electrical system while partially discharging the electrical system by the discharge circuit, determine an amount of change of the measured voltage of the electrical system occurring while partially discharging the electrical system by the discharge circuit, determine a difference amount between the amount of change and a predefined value, and recognize the discharge circuit is defective when the difference amount is greater than a predefined threshold.

11. The apparatus for diagnosing a discharge circuit according to claim 10, wherein the discharge circuit is configured such that the discharge circuit is defective after carrying out approximately 30 discharge cycles.

12. The apparatus for diagnosing a discharge circuit according to claim 10, wherein the discharge circuit is a first discharge circuit, wherein the control device is further configured to partially discharge the electrical system by a second discharge circuit before partially discharging the electrical system by the first discharge circuit.

13. The apparatus for diagnosing a discharge circuit according to claim 12, wherein the control device is further configured to further discharge the electrical system by the second discharge circuit after partially discharging the electrical system by the first discharge circuit.

14. The apparatus for diagnosing a discharge circuit according to claim 10, wherein the discharge circuit is a first discharge circuit, wherein the control device is further configured to partially discharge the electrical system by a second discharge circuit after partially discharging the electrical system by the first discharge circuit.

15. The apparatus for diagnosing a discharge circuit according to claim 10, wherein the electrical system includes a drive train.

* * * * *